United States Patent [19]

Kobayashi et al.

[11] Patent Number: 5,513,202
[45] Date of Patent: Apr. 30, 1996

[54] VERTICAL-CAVITY SURFACE-EMITTING SEMICONDUCTOR LASER

[75] Inventors: Yasuhiro Kobayashi, Osaka; Toyoji Chino, Toyonaka; Kenichi Matsuda, Moriguchi, all of Japan

[73] Assignee: Matsushita Electric Industrial Co., Ltd., Osaka, Japan

[21] Appl. No.: 393,209

[22] Filed: Feb. 23, 1995

[30] Foreign Application Priority Data

Feb. 25, 1994  [JP]  Japan ..................... 6-027939

[51] Int. Cl.$^6$ ............................................ H01S 3/19
[52] U.S. Cl. ................. 372/96; 372/45; 372/46; 372/92; 372/99
[58] Field of Search ............... 372/92, 96, 46, 372/50, 45, 99

[56] References Cited

U.S. PATENT DOCUMENTS

| 5,206,871 | 4/1993 | Deppe et al. | 372/45 |
|---|---|---|---|
| 5,258,990 | 11/1993 | Olbright et al. | 372/46 |
| 5,283,447 | 2/1994 | Olbright et al. | 257/85 |
| 5,293,392 | 3/1994 | Shieh et al. | 372/45 |
| 5,317,587 | 5/1994 | Ackley et al. | 372/45 |
| 5,324,964 | 6/1994 | Ackley et al. | 257/98 |
| 5,341,390 | 8/1994 | Yamada et al. | 372/45 |
| 5,351,256 | 9/1994 | Schneider et al. | 372/45 |
| 5,408,486 | 4/1995 | Shoji | 372/45 |
| 5,424,559 | 6/1995 | Kasahara | 372/50 X |
| 5,446,752 | 8/1995 | Ackley et al. | 372/46 |

FOREIGN PATENT DOCUMENTS

| 4-188885 | 7/1992 | Japan . |
|---|---|---|
| 5-235464 | 9/1993 | Japan . |

OTHER PUBLICATIONS

R. S. Geels et al., "Low Threshold Planarized Vertical–Cavity Surface–Emitting Lasers," IEEE Photonics Technology Letters, vol. 2, No. 4, Apr., 1990.

T. Kawakami et al., "Low Threshold Current Low–Voltage Vertical–Cavity Surface–Emitting Lasers with Low–Al–Content P–type Mirrors Grown by MOCVD", IEEE Photonics Technology Letters, vol. 4, No. 12, Dec. 1992.

*Primary Examiner*—James W. Davie
*Attorney, Agent, or Firm*—Ratner & Prestia

[57] ABSTRACT

A vertical-cavity surface-emitting semiconductor laser includes: a p-type bottom mirror having an upper face; a p-type spacer layer covering over the entire upper face of the p-type bottom mirror; an active region including an active layer having a bottom face smaller than the upper face of the p-type bottom mirror, the active region being formed on the p-type spacer layer; an n-type spacer layer formed on the active region; and an n-type top mirror formed on the n-type spacer layer, wherein a sum d of optical path lengths of the p-type spacer layer, the active region and the n-type spacer layer in a perpendicular direction satisfies a relationship expressed by $d=(1+n)\cdot\lambda/2$ (n: natural number) with respect to a wavelength $\lambda$ of light oscillated from the active region.

20 Claims, 9 Drawing Sheets

VERTICAL-CAVITY SURFACE-EMITTING SEMICONDUCTOR LASER

BACKGROUND OF THE INVENTION

1. Field of the Invention

The present invention relates to a vertical-cavity surface-emitting semiconductor laser, and more particularly, to a vertical-cavity surface-emitting semiconductor laser continuously oscillating at low threshold voltages.

2. Description of the Related Art

The vertical-cavity surface-emitting semiconductor laser (hereinafter, referred to as "VCSEL"), which is one of the key devices for optical data processing, optical interconnection or the like, has been increasingly studied and developed. The VCSEL consists of an active region (oscillation wavelength: $\lambda$), serving as a light emitting section, and of distributed Bragg reflectors (DBRs) made of semiconductors or dielectric materials and located on the top and bottom of the active region. The DBR has a film thickness of $\lambda/4$, and consists of a multi-layered film composed of stacks of two kinds of alternating dielectric layers having refractive indexes different from each other. Because of the convenience of the fabrication of the device, thermal conductivity and the like, a DBR made of semiconductor is mainly used. Through such layers, a current is injected into the active region sandwiched by a pair of p-type and n-type DBRs, so that a laser beam is oscillated from the active region.

In the VCSEL made of a GaAs-type semiconductor of a short wavelength, when forming the DBR by using GaAs layers and AlAs layers, due to the large difference of refractive index between the GaAs and AlAs layers, a DBR with the highest reflection efficiency can be formed. However, there is a problem in that, in the hetero junction portion formed between the GaAs and AlAs layers of a p-type DBR, the spike of the valence band arising due to the difference of the bandgap and the differences of electron affinity becomes maximized, which results in an increase in electric resistance. This is a problem common to all types of the VCSEL having the above-mentioned structure. For example, it has been proposed to solve this problem by introducing a grated layer onto the hetero interface (e.g., IEEE Photonics Technology Letters, 2(1990) PP. 234–236).

However, the proposed solution would require structure of the device to be more complicated. In addition, by obtaining such a structure of the device, the shutter of the MBE (Molecular Beam Epitaxy) device would have to be opened several hundred to several thousand times. So, there would be a problem in that the MBE device is likely have other troubles.

There is a report that the DBR made of p-type GaAs/AlGaAs of which the Al composition ratio is 0.6 or less is free from the problem of high resistance caused by the spike (e.g., IEEE Photonics Technology Letters, 4(1990) PP. 1325–1327). However, the difference of the refractive index between the AlGaAs layer of which Al composition ratio is 0.6 or less and the GaAs layer is small. Accordingly, in order to make the device serve as a DBR, it is necessary to increase the number of pairs of the AlGaAs and GaAs layers.

On the other hand, a method for realizing the device of low resistance by the structure which can be obtained relatively easily is disclosed in Japanese Laid-Open Patent Publication No. 5-235464. This conventional VCSEL 610 will be described with reference to FIG. 12. In the VCSEL 610, a p-type mirror 604 made of GaAs/AlAs is formed on a GaAs substrate 605. On the p-type mirror 604, an electrode 606 is formed. On a part of the top face of the p-type mirror 604, an active layer 603 consisting of an $In_{0.2}Ga_{0.8}As$ strained super lattice layer is formed. Furthermore, on the top of the active layer 603, an n-type mirror 602 made of GaAs/AlAs is formed. Also on the n-type mirror 602, an electrode 601 is formed. A laser beam 607 generated in the active layer 603 is emitted to the outside through the GaAs substrate 605.

In the VCSEL 610, the current flowing through the active layer 603 spreads all over the p-type mirror 604. As shown in FIG. 12, the active layer 603 is formed on only a part of the upper face of the p-type mirror 604. In general, the resistance is inversely proportional to the area of the cross section of a current path. Accordingly, the resistance of the p-type mirror 604 decreases by expanding the current path.

Incidentally, Japanese Laid-Open Patent Publication No. 4-188885 discloses a VCSEL 720 having the structure as shown in FIG. 13.

The VCSEL 720 has a semiconductor structure in which an n-type GaAs buffer layer 703, a DBR mirror 704, an n-type $Al_{0.1}Ga_{0.9}As$ current introduction layer 705, a p-type GaAs active layer 706, a p-type $Al_{0.4}Ga_{0.6}As$ cladding layer 707, and a p-type $Al_{0.1}Ga_{0.9}As$ contact layer 708 are layered in this order on an n-type GaAs substrate 702. The p-type $Al_{0.1}Ga_{0.9}As$ contact layer 708 and the p-type GaAs active layer 706 and a part of the n-type $Al_{0.1}Ga_{0.9}As$ current introduction layer 705 are etched to be cylindrical. The space around the cylinder is filled with a $ZnS_{0.06}Se_{0.94}$ layer 709. Furthermore, on the surface of the cylinder and the layer 709, an $SiO_2/\alpha$-Si dielectric multilayer film 711 and a p-type ohmic electrode 710 are formed. On the surface of the n-type current introduction layer 705, an n-type ohmic electrode 701 is formed.

FIG. 14 schematically shows the path of the current flowing within the VCSEL 720 shown in FIG. 13. As shown in FIG. 13, a current 712 flowing through the active layer 706 does not flow into the DBR mirror 704 but solely into the current introduction layer 705. Hence, the problem of the high resistance in the hetero junction portion of the mirror can be prevented in principle. Thus, it is possible to provide a VCSEL of a low resistance.

In the conventional VCSEL 610, by using the p-type mirror 604 as a lower mirror and making the area of the p-type mirror 604 larger than that of the active layer 603, the forward threshold voltage can be greatly reduced from about 45 V to about 2 V. However, the serial resistance is large, and the operational voltage is still high. As a result, the VCSEL 610 can perform only the pulse oscillation at room temperatures.

Accordingly, in order to make the VCSEL continuously oscillate at a room temperature, it is required to further reduce the resistance of the p-type mirror.

On the other hand, the conventional VCSEL 720 is provided with the current introduction layer 705 for reducing the resistance, thus being configured so as not to allow the current to flow into the DBR mirror 704. In such a configuration, it is most important to reduce the sheet resistance of the current introduction layer 705. However, because the current introduction layer 705 has a thickness of about 100 nm, the sheet resistance cannot be sufficiently reduced. Also, since the current introduction layer 705 is not thick enough, it is difficult to form an ohmic contact of a low resistance between the n-type ohmic electrode 701 and the current introduction layer 705. Consequently, the resultant VCSEL cannot have a low resistance.

The present invention can solve the above-mentioned problems associated with a conventional VCSEL, and provide a VCSEL with a low resistance.

SUMMARY OF THE INVENTION

The vertical-cavity surface-emitting semiconductor laser includes: a p-type bottom mirror having an upper face; a p-type spacer layer covering over the entire upper face of the p-type bottom mirror; an active region including an active layer having a bottom face smaller than the upper face of the p-type bottom mirror, the active region being formed on the p-type spacer layer; an n-type spacer layer formed on the active region; and an n-type top mirror formed on the n-type spacer layer, wherein a sum d of optical path lengths of the p-type spacer layer, the active region and the n-type spacer layer in a perpendicular direction, satisfies a relationship expressed by $d=(1+n)\cdot\lambda/2$ (n: natural number) with respect to a wavelength $\lambda$ of light oscillated from the active region.

In one embodiment of the invention, the p-type spacer layer has an optical path length in the perpendicular direction at least more than $\lambda/2$.

In another embodiment of the invention the p-type spacer layer has an impurity concentration higher than that of the p-type bottom mirror.

In still another embodiment of the invention, the vertical-cavity surface-emitting semiconductor laser further includes a p-type electrode formed in a region adjacent to a region of the upper face of the p-type bottom mirror in which the active region is formed.

In still another embodiment of the invention, the vertical-cavity surface-emitting semiconductor laser further includes an insulating film covering a side face of the active region.

According to another aspect of the invention, a vertical-cavity surface-emitting semiconductor laser includes: a first p-type bottom mirror; a second p-type bottom mirror having an upper face of a sheet resistance lower than that of the first p-type bottom mirror, the second p-type bottom mirror being formed on the first p-type bottom mirror; a p-type spacer layer formed on the second p-type bottom mirror; an active region including an active layer having a bottom face smaller than the upper face of the second p-type bottom mirror, the active region being formed on the p-type spacer layer; an n-type spacer layer formed on the active region; and an n-type top mirror formed on the n-type spacer layer.

In one embodiment of the invention, the second p-type bottom mirror is a p-type graded mirror.

In another embodiment of the invention, the second p-type bottom mirror has a plurality of pairs each consisting of a first semiconductor layer and a second semiconductor layer, and layers each interposed between the first and second semiconductor layers and having a composition which changes continuously or in discrete steps from a composition of the first semiconductor layer to that of the second semiconductor layer.

In still another embodiment of the invention, the second p-type bottom mirror has three pairs each consisting of the first and second semiconductor layers.

In still another embodiment of the invention, the second p-type bottom mirror has a plurality of pairs each consisting of a first semiconductor layer and a second semiconductor layer, the first semiconductor layer being made of GaAs, and the second semiconductor layer being made of $Al_xGa_{1-x}As$ ($x \leq 0.6$).

In still another embodiment of the invention, the second p-type bottom mirror has three pairs each consisting of the first and second semiconductor layers.

According to still another aspect of the invention, a vertical-cavity surface-emitting semiconductor laser includes: a p-type bottom mirror having an upper face; a p-type spacer layer formed on the p-type bottom mirror; an active region including an active layer having a bottom face smaller than the upper face of the p-type bottom mirror, the active region being formed on the p-type spacer layer; an n-type spacer layer formed on the active region; an n-type top mirror formed on the n-type spacer layer; and a p-type electrode formed in a region adjacent to a region of the upper face of the p-type bottom mirror in which the spacer layer is formed.

In one embodiment of the invention, the vertical-cavity surface-emitting semiconductor laser further includes an insulating film covering a side face of the active region.

According to still another aspect of the invention, a vertical-cavity surface-emitting semiconductor laser includes: a p-type bottom mirror having an upper face, wherein the upper face includes a first region and a second region surrounding the first region, a portion of the p-type bottom mirror below the second region has a lower resistivity than that of a portion of the p-type bottom mirror below the first region; a p-type spacer layer formed on the first region of the upper face of the p-type bottom mirror; an active region including at least an active layer having a bottom face smaller than the upper face of the p-type bottom mirror, the active region being formed on the p-type spacer layer; an n-type spacer layer formed on the active region; and an n-type top mirror formed on the n-type spacer layer.

In one embodiment of the invention, a sum d of optical path lengths of the p-type spacer layer, the active region and the n-type spacer layer in a perpendicular direction satisfies a relationship expressed by $d=(1+n)\cdot\lambda/2$ (n: natural number) with respect to a wavelength $\lambda$ of light oscillated from the active region.

In another embodiment of the invention, the p-type spacer layer has an optical path length at least more than $\lambda/2$.

In still another embodiment of the invention, the p-type spacer layer has an impurity concentration higher than that of the p-type bottom mirror.

According to the present invention, the area of the bottom face of the active region is made smaller than that of the upper face of the p-type bottom mirror; and the p-type spacer layer having an impurity concentration higher than that of the p-type bottom mirror and covering over the entire upper face of the p-type bottom mirror is disposed between the active region and the p-type bottom mirror. In this way, the resistance of the VCSEL as a whole can be reduced, which allows the VCSEL to continuously oscillate at a room temperature.

Furthermore, the second p-type bottom mirror having a graded mirror structure is provided on the first p-type bottom mirror, whereby the spike of the valence band is eliminated in the GaAs/AlAs hetero junction interface. As a result, even at the same impurity concentration, the second p-type bottom mirror has a lower sheet resistance than that of the first p-type bottom mirror. Consequently, in the VCSEL, when a current flows through the second p-type bottom mirror, due to the low sheet resistance, the current flows to spread all over the second p-type bottom mirror, and further, flows to disperse all over the upper face of the first p-type bottom mirror. Thus, the current path can be expanded, and the voltage of the VCSEL as a whole can be reduced, which allows the VCSEL to continuously oscillate at a room temperature. When the mirror using $Al_{0.5}Ga_{0.5}As$ as the second p-type bottom mirror is disposed as the second p-type bottom mirror, in place of the graded mirror, in the interface of $Al_{0.5}Ga_{0.5}As$, the spike of the balance band due to the difference of a bandgap and the difference of an electron affinity becomes small. As a result, even at the same impurity concentration, the second p-type bottom mirror has a lower sheet resistance than that of the first p-type bottom mirror.

In the region of the upper face of the p-type bottom mirror adjacent to the region in which the p-type spacer layer is disposed, the p-type electrode is disposed; and the side faces of the n-type top mirror, the n-type spacer layer, the active region and the p-type spacer layer are covered by an insulating film. In this way, the p-type electrode can be disposed on the upper face of the p-type bottom mirror so as to be close to the p-type spacer layer without being electrically in contact with the active region. As a result, the p-type electrode functions as a low resistance layer as well as an electrode, which contributes to the enhancement of the expansion of the current path in the p-type mirror.

Moreover, in the p-type bottom mirror, the second region, which is the upper face of a high impurity concentration layer, surrounds the first region. As a result, the operational current dispersedly flows to the high impurity concentration layer having a low resistance ratio. In this way, the resistance of the p-type mirror is sufficiently reduced, and the continuous oscillation at a room temperature is attained.

In this way, according to the present invention, the path of the operational current is expanded by a means provided in the upper portion within the p-type mirror or above the p-type mirror. Thus, a satisfactory VCSEL capable of reducing the resistance of a laser and performing the continuous oscillation at a room temperature is realized.

Thus, the present invention described herein makes possible the advantage of providing a VCSEL capable of reducing the resistance of a laser and continuously oscillating at a room temperature.

This and other advantages of the present invention will become apparent to those skilled in the art upon reading and understanding the following detailed description with reference to the accompanying figures.

DESCRIPTION OF THE PREFERRED EMBODIMENTS

The examples of the present invention will be described hereinafter, with reference to the accompanying drawings.

Example 1

Figure 1:
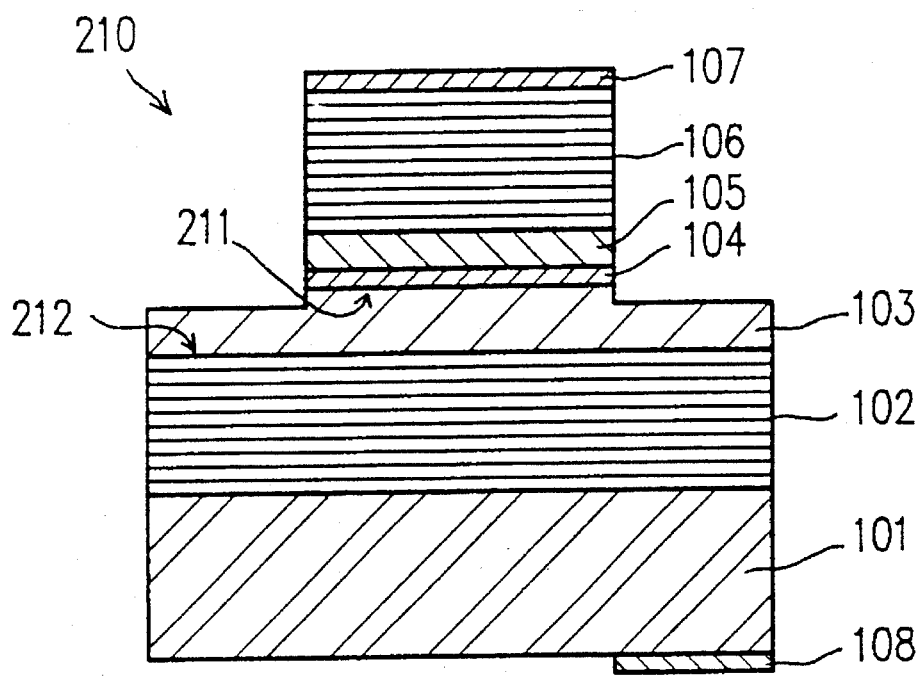
FIG. 1 is a cross sectional view showing a VCSEL of a first example of the present invention.

FIG. 1 shows a schematic cross section of a VCSEL 210.

The VCSEL 210 includes a semiconductor substrate 101 made of p-type GaAs, a p-type bottom mirror 102 formed on the semiconductor substrate 101, a p-type spacer layer 103 formed on the p-type bottom mirror 102. The VCSEL 210 further includes an active region 104 formed on the p-type spacer layer 103, an n-type spacer layer 105 formed on the active region 104 and an n-type top mirror 106 formed on the n-type spacer layer 105. A p-type electrode 108 is provided on the semiconductor substrate 101 so as to be electrically connected thereto. An n-type electrode 107 is provided on the n-type top mirror 106 so as to be electrically connected thereto.

The p-type bottom mirror 102 is a distributed Bragg reflector (DBR), having a multi-layered structure composed of 24.5 pairs of a p-type GaAs layer (thickness: 69.6 nm, impurity concentration: $3\times10^{18}$ cm$^{-3}$) and a p-type AlAs layer (thickness: 82.8 nm, impurity concentration: $3\times10^{18}$ cm$^{-3}$). The n-type top mirror 106 is also a DBR, having a multi-layered structure composed of 25 pairs of an n-type GaAs layer (thickness: 69.6 nm, impurity concentration: $3\times10^{18}$ cm$^{-3}$) and a p-type AlAs layer (thickness: 82.8 nm, impurity concentration: $3\times10^{18}$ cm$^{-3}$).

The p-type spacer layer 103 is made of $Al_{0.5}Ga_{0.5}As$ and has a thickness of 86 nm and an impurity concentration of $5\times10^{18}$ cm$^{-3}$. The n-type spacer layer 105 is made of $Al_{0.5}Ga_{0.5}As$ and has a thickness of 86 nm and an impurity concentration of $3\times10^{18}$ cm$^{-3}$. The n-type spacer layer 105 may be an undoped layer.

The active region 104 consists of a semiconductor multilayer provided with a strained quantum well structure and including an undoped $In_{0.2}Ga_{0.8}As$ layer, and oscillates a laser beam of a wavelength of 980 nm. Moreover, the area of the bottom face 211 of the active region 104 is smaller than that of an upper face 212 of the p-type bottom mirror 102.

The p-type spacer layer 103, the active region 104 and the n-type spacer layer 105 have optical path lengths of 278 nm, 424 nm, and 278 nm, respectively, in the perpendicular direction. Each of the optical path length is obtained by multiplying a thickness of each layer by the refractive index thereof. The perpendicular direction is defined as a direction along which a thickness of the layer is measured. The sum of the optical path lengths of the p-type spacer layer 103, the active region 104 and the n-type spacer layer 105 is therefore 980 nm, which is equal to the wavelength of the laser beam oscillated from the active region 104.

The VCSEL 210 is fabricated by the following procedure.

First, the semiconductor layers 102 through 106 are epitaxially grown on the semiconductor substrate 101 by the MBE method, MOCVD method or the like. The n-type electrode 107 is formed on the n-type top mirror 106. Then, using the n-type electrode 107 as a mask, the portions of the semiconductor layers 102 to 106 are etched by dry etching.

At this dry etching process, it is important that the active region 104 is completely etched. A part of the p-type spacer layer 103 may also be etched. However, it is necessary that the entire upper face of the p-type bottom mirror 102 is completely covered by the p-type spacer layer 103. In addition, it is preferable that the thickness of the part of the p-type spacer layer 103 on which the active region 104 is not formed, does not become so small. After this process, the p-type electrode 108 is formed on the semiconductor substrate 101. Then, an alloy process is performed for forming ohmic contacts between the n-type electrode 107 and the n-type top mirror 106 and between the p-type electrode 108 and the semiconductor substrate 101. The n-type electrode 107 and the p-type electrode 108 may be formed by using an electrode material not requiring an alloy process.

The VCSEL 210 is arranged so that the area of the upper face 212 of the p-type bottom mirror 102 is larger than that of the bottom face 211 of the active region 104. Consequently, the current path is expanded in the portion from the active region 104 to the p-type bottom mirror 102, thereby lowering the resistance of the p-type mirror.

However, even if the current path is expanded by virtue of the p-type bottom mirror 102 alone, the resistance is still high. As for laser characteristics, only the pulse oscillation at room temperatures is realized by this arrangement.

Therefore, in the present example, the portions from the n-type electrode 107 to the active region 104 are etched in such a manner that the surface of the p-type spacer layer 103 is exposed and the entire upper face of the p-type bottom mirror 102 is covered by the p-type spacer layer 103. In comparison with the p-type bottom mirror 102, the p-type spacer layer 103 has an higher impurity concentration and a lower resistance. Accordingly, the current path is also expanded in the p-type spacer layer 103. Thus, the resistance of the VCSEL 210 as a whole is further reduced.

Figure 2:
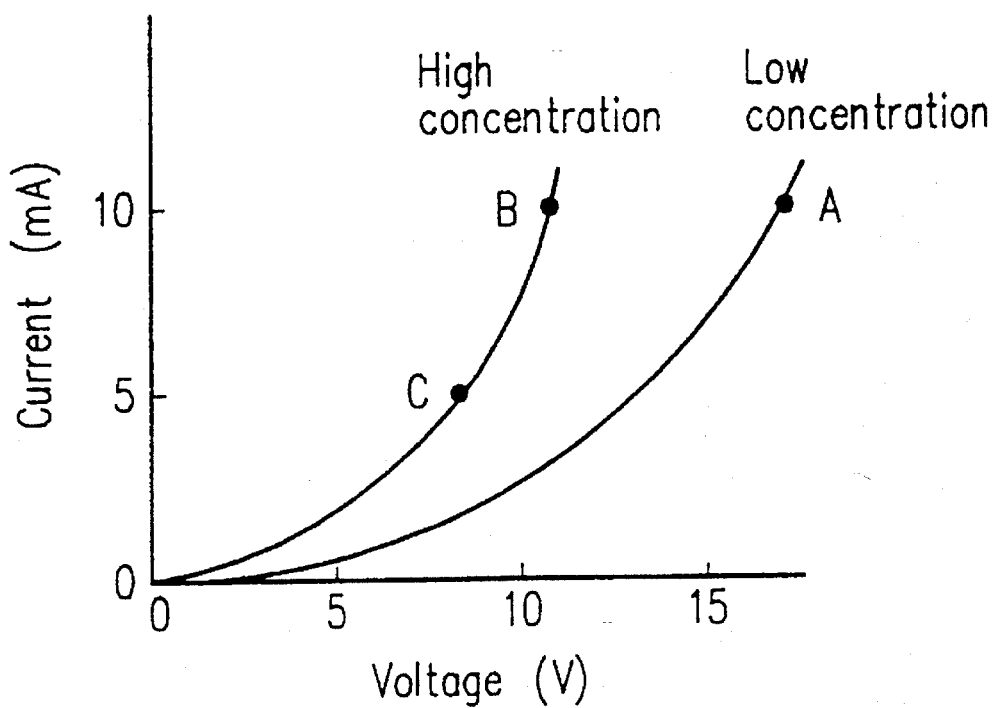
FIG. 2 is a graph showing the relationship between the impurity concentration and current-voltage characteristics of the p-type space layer.

Referring to FIG. 2 and Table 1, the effects of the p-type spacer layer 103 disposed on the p-type bottom mirror 102 of an impurity concentration of $3 \times 10^{18}$ cm$^{-3}$ will be specifically described.

Table 1 shows the impurity concentrations of the p-type spacer layer and the p-type bottom mirror, and the numbers of the layers of the n-type top mirror and the p-type bottom mirror, with respect to the VCSEL described with reference to FIG. 2.

TABLE 1

|  | Point A | Point B | Point C |
| --- | --- | --- | --- |
| Concentration of p-type spacer layer (cm$^{-3}$) | $1.5 \times 10^{18}$ | $5 \times 10^{18}$ | $5 \times 10^{18}$ |
| Concentration of p-type bottom mirror (cm$^{-3}$) | $3 \times 10^{18}$ | $3 \times 10^{18}$ | $3 \times 10^{18}$ |
| Number of N-type top mirror (pairs) | 15 | 15 | 24.5 |
| Number of N-type bottom mirror (pairs) | 2.35 | 2.35 | 25 |

TABLE 1-continued

In the case where the impurity concentration of the p-type spacer layer 103 is $1.5 \times 10^{18}$ cm$^{-3}$ (in the case of low concentration as shown in FIG. 2), as indicated by point A, a voltage of approximately 17 V is necessary for allowing a current of 10 mA to flow through the VCSEL. In this case, since the operational voltage is still high, only the pulse oscillation at room temperatures can be realized. On the other hand, when the impurity concentration of the p-type spacer layer 103 is raised up to $5 \times 10^{18}$ cm$^{-3}$ (in the case of high concentration shown in FIG. 2), as indicated by point B, it is possible to cause a current of 10 mA to flow by applying a voltage of about 10 V to the VCSEL. Thus, the p-type spacer layer 103 has the effects of enhancing the expansion of a current through the p-type bottom mirror and lowering the resistance of the VCSEL as a whole. The larger effects are obtained as the impurity concentration of the p-type spacer layer 103 becomes higher. It is desirable that the impurity concentration of the p-type spacer layer 103 is higher than that of the p-type bottom mirror 102.

In an actual laser structure, in the case of the combination of the p-type bottom mirror 102 having 23.5 pairs and the n-type top mirror 106 having 15 pairs, the threshold current is about 10 mA. If the impurity concentration of the p-type spacer layer is a high concentration ($5 \times 10^{18}$ cm$^{-3}$), the operational points becomes point B in FIG. 2. However, in this case, the operational voltage is still high, and only the pulse oscillation at a room temperature is realized.

Figure 3:
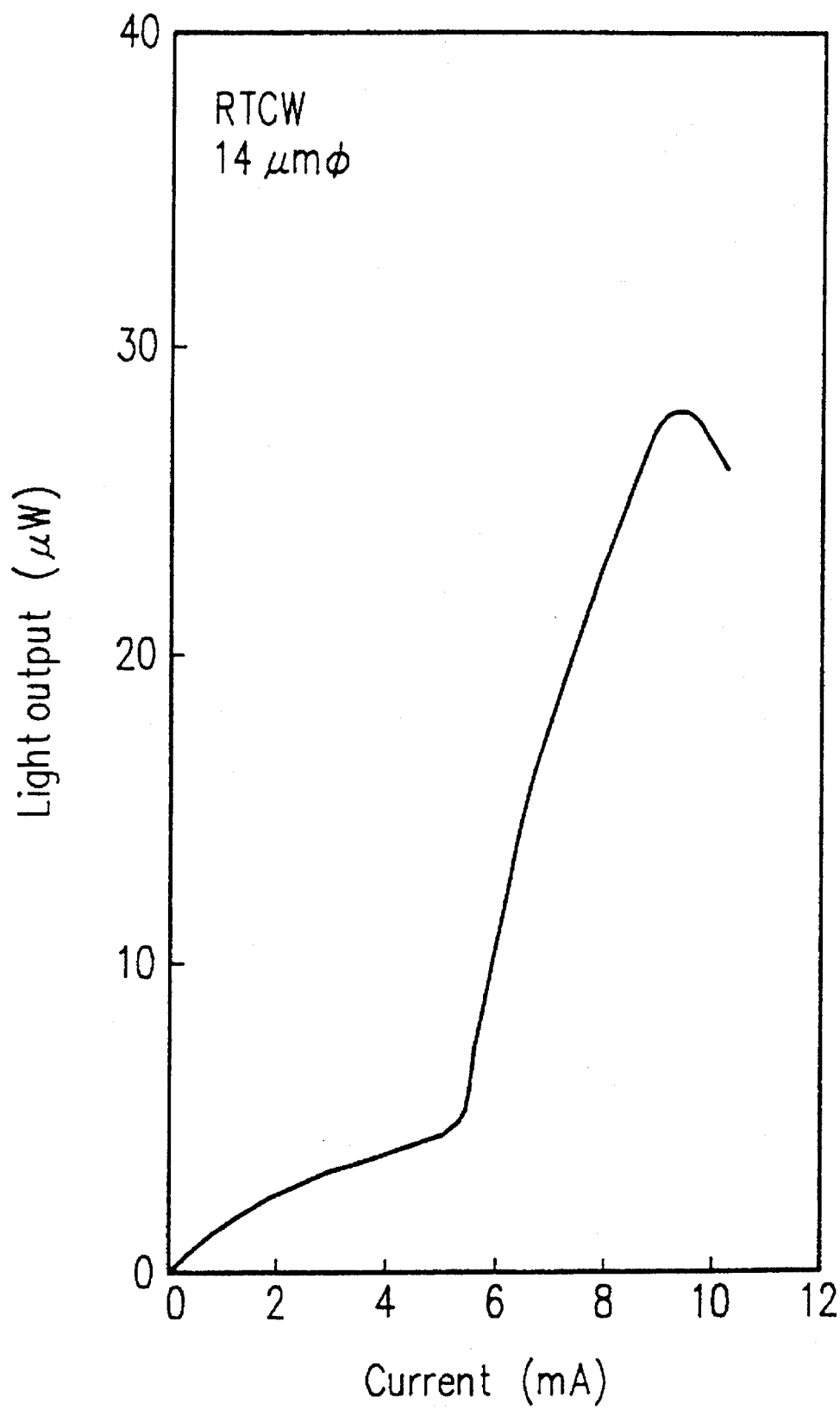
FIG. 3 is a graph showing light output-current characteristics of the VCSEL of the first example of the present invention.

On the other hand, in the case of the combination of the p-type bottom mirror 102 having 24.5 pairs and the n-type top mirror 106 having 25 pairs, the threshold current is about 5 mA. In this case, if the impurity concentration of the p-type spacer layer is a high concentration ($5 \times 10^{18}$ cm$^{-3}$), the operational point becomes point C in FIG. 2. In this case, the operational voltage is sufficiently reduced. As a result, the continuous oscillation at a room temperature is attained. FIG. 3 shows the light output-current characteristics recorded when the continuous oscillation was performed at a room temperature.

As described hereinbefore, according to the present example, the area of the bottom face of the active region 104 is made smaller than that of the upper face of the p-type bottom mirror 102. Moreover, the p-type spacer layer 103 which has an impurity concentration higher than that of the p-type bottom mirror 102 and covers the entire upper face of the p-type bottom mirror 102 is provided between the active region 104 and the p-type bottom mirror 102. This arrangement allows the resistance of the VCSEL as a whole to be reduced and enables the VCSEL to perform continuous oscillations at room temperatures.

Figure 4A:
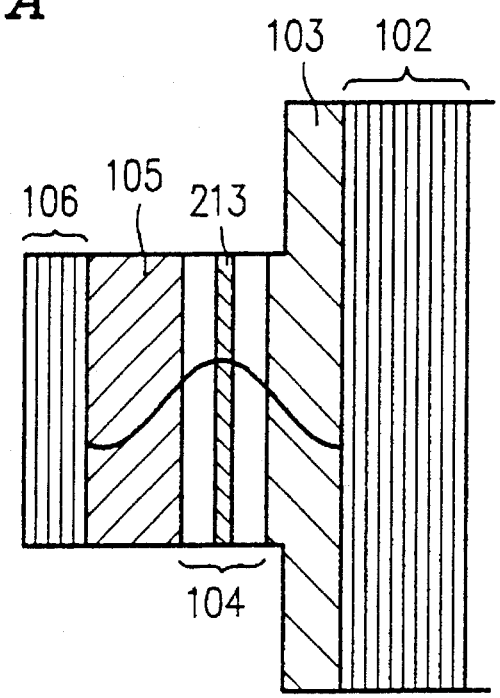
FIGS. 4A and 4B show the relationship between the thickness of the p-type space layer and the emission wavelength of the VCSEL of the first example of the present invention.
Figure 4B:
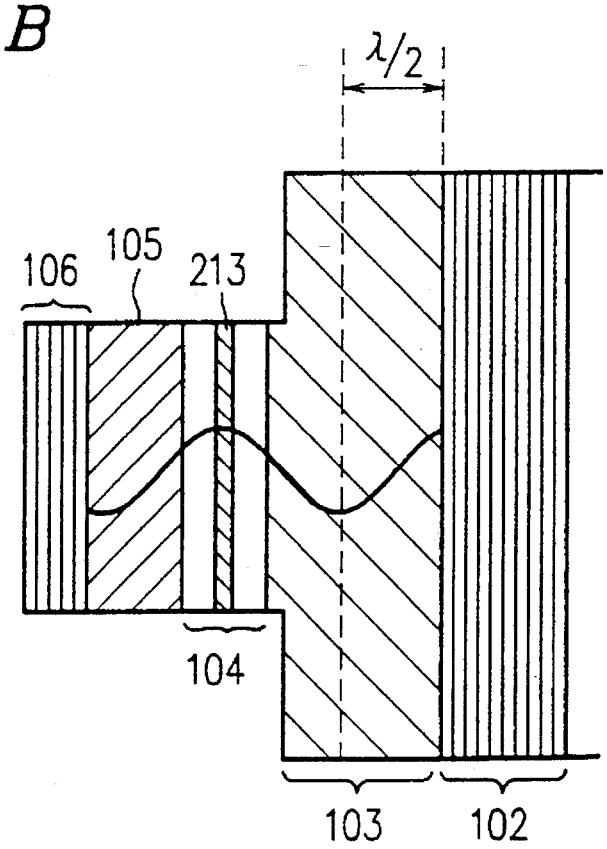

In the present example, the sum d of the optical path lengths of the p-type spacer layer 103, the active region 104 and the n-type spacer layer 105 in the perpendicular direction is set to be 980 nm. Since the perpendicular direction corresponds to the direction along optical path length of the resonator of the VCSEL, the optical path length of the resonator is 980 nm. However, the optical path length d of the resonator may be determined so as to satisfy the relationship expressed by d=(n+1)·λ/2 (n: natural number). As shown in FIG. 4A, the optical path length of 980 nm of the present example corresponds to the case where n=1 in the above equation. The position of a quantum well portion 213 within the active region 104 corresponds to the loop of the standing wave within the resonator, formed by the n-type top mirror 106 and the p-type bottom mirror 102. In order to make the laser oscillate in this way, it is necessary for the quantum well to be positioned at the loop of the standing wave. In the case where n=2, when the thickness of the p-type spacer layer 103 increases only by the optical path length corresponding to λ/2 (i.e., 490 nm), the position of the quantum well coincides with that of the loop of the standing wave as shown in FIG. 4B. In this case, the current path is expanded depending on the increase amount of the thickness of the p-type spacer layer 103. As a result, it becomes possible to make the laser oscillate at a lower voltage.

Example 2

Figure 5:
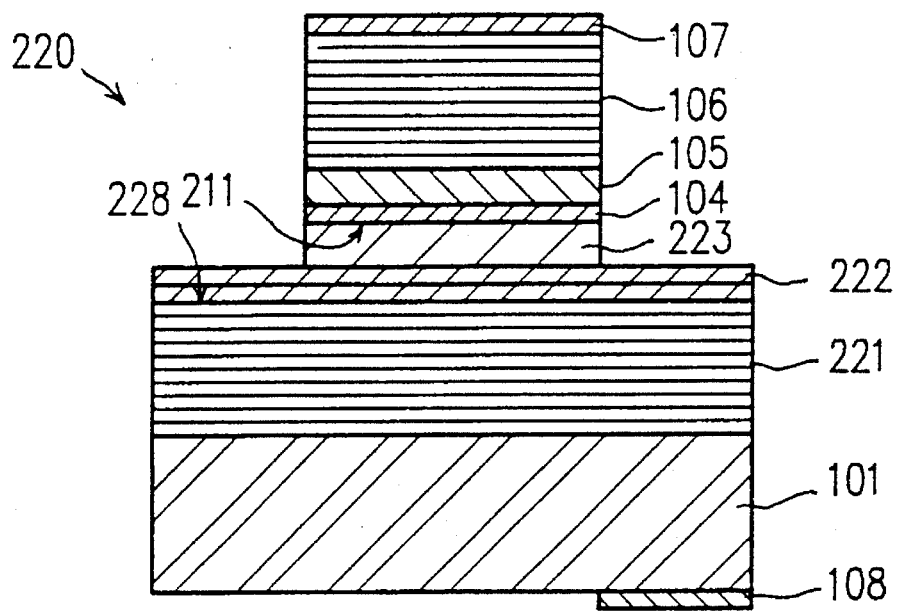
FIG. 5 is a cross sectional view showing a VCSEL of a second example of the present invention.

The second example of the present invention will be described with reference to the accompanying drawings. FIG. 5 schematically shows a cross section of a VCSEL 220. In FIG. 5, the components similar to those of the first example will be denoted by the same reference numerals.

The VCSEL 220 includes a semiconductor substrate 101 made of p-type GaAs, a first p-type bottom mirror 221 formed on the semiconductor substrate 101, a second p-type bottom mirror 222 formed on the first p-type bottom mirror 221 and a p-type spacer layer 223 formed on the second p-type bottom mirror 222. The VCSEL 220 further includes an active region 104 formed on the p-type spacer layer 223, an n-type spacer layer 105 formed on the active region 104 and an n-type top mirror 106 formed on the n-type spacer layer 105. A p-type electrode 108 is provided on the semiconductor substrate 101 so as to be electrically connected thereto. An n-type electrode 107 is provided on the n-type top mirror 106 so as to be electrically connected thereto.

The first p-type bottom mirror 221 is a DBR, having a multi-layered structure composed of 21.5 pairs of a p-type GaAs layer (thickness: 69.6 nm, impurity concentration: $3 \times 10^{18}$ cm$^{-3}$) and a p-type AlAs layer (thickness: 82.8 nm, impurity concentration: $3 \times 10^{18}$ cm$^{-3}$). The n-type top mirror 106 is also a DBR, having a multi-layered structure of depositing 25 pairs of an n-type GaAs layer (thickness: 69.6 nm, impurity concentration: $3 \times 10^{18}$ cm$^{-3}$) and a p-type AlAs layer (thickness: 82.8 nm, impurity concentration: $3 \times 10^{18}$ cm$^{-3}$).

Figure 6:
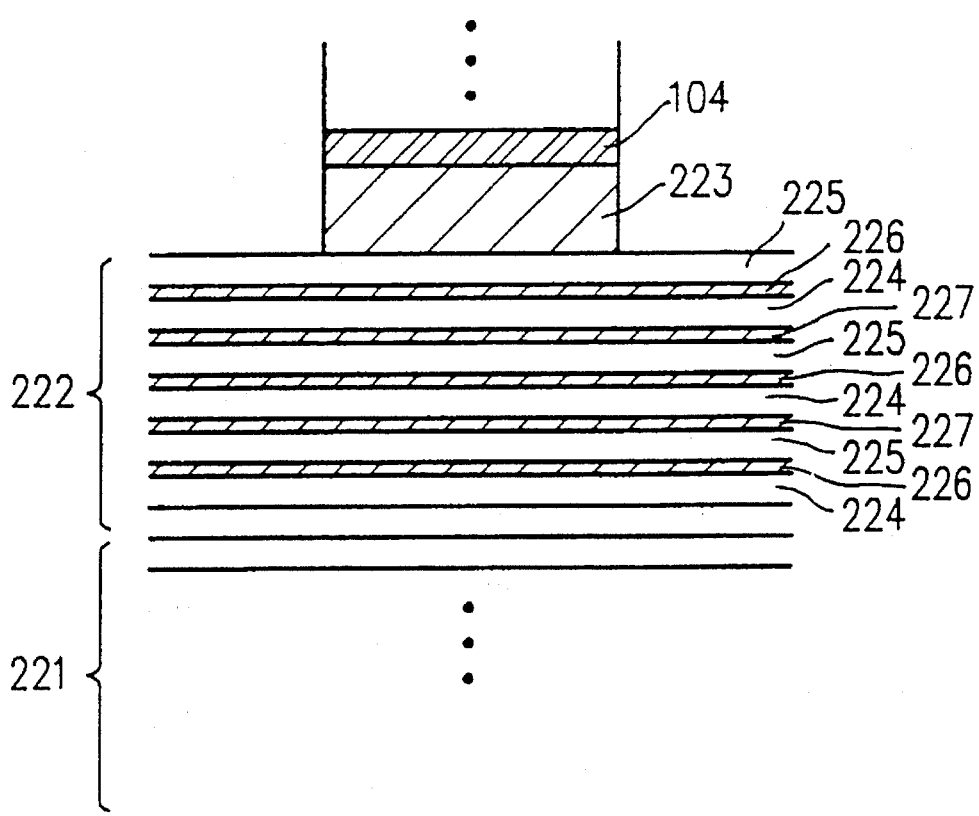
FIG. 6 is a diagram explaining details of the structure of a p-type graded mirror of the VCSEL of the second example of the present invention.

The second p-type bottom mirror 222 is also a DBR, and is composed of three pairs of p-type graded mirrors. Specifically, as shown in FIG. 6, it has a multi-layered structure composed of three pairs of a p-type GaAs layer 224 (thickness: 69.6 nm, impurity concentration: $3 \times 10^{18}$ cm$^{-3}$) and a p-type AlAs layer 225 (thickness: 82.8 nm, impurity concentration: $3 \times 10^{18}$ cm$^{-3}$). Between each of the p-type GaAs layers 224 and the p-type AlAs layers 225, an Al$_x$Ga$_{1-x}$As layer 226 or 227, in which the composition ratio x of Al changes continuously or in discrete steps, is inserted. In the Al$_x$Ga$_{1-x}$As layers 226 and 227, the composition ratios of Al and Ga gradually change so that x=0 (x: composition ratio of Al) on the face of the layer in contact with the p-type GaAs layers 224 and x=1 on the face of the layer in contact with the p-type GaAlAs layers 225. Accordingly, the Al$_x$Ga$_{1-x}$As layer 226 has a composition ratio of Al gradually increasing from the bottom face to the top face, and the Al$_x$Ga$_{1-x}$As layer 227 has a composition ratio of Al gradually decreasing from the bottom face to the top face.

The p-type spacer layer 223 is made of Al$_{0.5}$Ga$_{0.5}$As and has a thickness of 86 nm and an impurity concentration of $3 \times 10^{18}$ cm$^{-3}$.

The active region 104 consists of a semiconductor multilayer provided with a strained quantum well structure and includes an undoped In$_{0.2}$Ga$_{0.8}$As layer, and oscillates a laser beam of a wavelength of 980 nm. Moreover, the area of the bottom face 211 of the active region 104 is smaller than that of an upper face 228 of the first p-type bottom mirror 221.

The n-type spacer layer 105 is made of Al$_{0.5}$Ga$_{0.5}$As and has a thickness of 86 nm and an impurity concentration of $3 \times 10^{18}$ cm$^{-3}$. The n-type spacer layer 105 may be an undoped layer. The n-type top mirror 106 is also a DBR, and has a multi-layered structure of 25 pairs of an n-type GaAs layer (thickness: 69.6 nm, impurity concentration: $3 \times 10^{18}$ cm$^{-3}$) and an n-type AlAs layer (thickness: 82.8 nm, impurity concentration: $3 \times 10^{18}$ cm$^{-3}$).

The VCSEL 220 of the present example is fabricated in the following procedure.

First, the semiconductor layers 221 through 223 and 104 through 106 are epitaxially grown on the semiconductor substrate 101 by the MBE method, MOCVD method or the like. The n-type electrode 107 is formed on the n-type top mirror 106. Then, using the n-type electrode 107 as a mask, the portions of the semiconductor layers 102 to 106 are etched by dry etching. Thereafter, the p-type electrode 108 is formed on the semiconductor substrate 101. An alloy process is performed, and thereby ohmic contacts are formed between the n-type electrode 107 and the n-type top mirror 106 and between the p-type electrode 108 and the semiconductor substrate 101. It is also possible to form the n-type electrode 107 and the p-type electrode 108 by using an electrode material not requiring an alloy process.

In the VCSEL 220 of the present example, the second p-type bottom mirror 222 provided with a graded mirror structure is disposed on the first p-type bottom mirror 221. By providing the graded mirror structure, the spike of the balance band is eliminated in the hetero junction interface of GaAs/AlAs. As a result, even at the same impurity concentration, the second p-type bottom mirror 222 has a lower sheet resistance than that of the first p-type bottom mirror 221.

Accordingly, in the VCSEL 220, when the current flows through the second p-type bottom mirror 222, the current flows so as to spread all over the second p-type bottom mirror 222 due to a low sheet resistance. Furthermore, the current flows dispersedly all over the upper face of the first p-type bottom mirror 221. Thus, it becomes possible to expand the current path, which causes the resistance of the VCSEL 220 as a whole to be reduced. This allows the continuous oscillation at room temperatures.

The graded mirror structure normally requires a relatively complicated fabrication process, because it needs to have a layer of which the composition varies continuously or in discrete steps along with the depth of the layer. However, according to the present example, it is sufficient to provide three pairs of a GaAs layer and an AlAs layer and six Al$_x$Ga$_{1-x}$As layers each having a composition of Al varying continuously or in discrete steps and interposed between the GaAs and AlAs layers, as the second p-type bottom mirror 222. Hence, compared with the case where the entire p-type bottom mirror is consisting of the graded mirror, the fabrication process is greatly simplified. The number of the layered pairs of the GaAs layer and the AlAs layer may be other than three. However, in the case of less than three, the resistance cannot be sufficiently reduced. Meanwhile, in the case where more than three pairs are layered, the fabrication process becomes complicated.

According to one configuration of the VCSEL 220 of the present example, the p-type spacer layer 223 may cover the entire upper face of the second p-type mirror 222. According to another configuration, the optical path length of the resonator, which is the sum d of the total optical path lengths of the n-type spacer layer 105, the active region 104 and the p-type spacer layer 223 in the perpendicular direction may be determined so as to satisfy the relationship expressed by $d=(n+1)\cdot\lambda/2$ (n: natural number). According to yet another configuration, the impurity concentration of the p-type spacer layer 223 may be higher than that of the second p-type mirror 222. By employing such configurations, the effects as described for the first example are also obtainable.

Example 3

Figure 7:
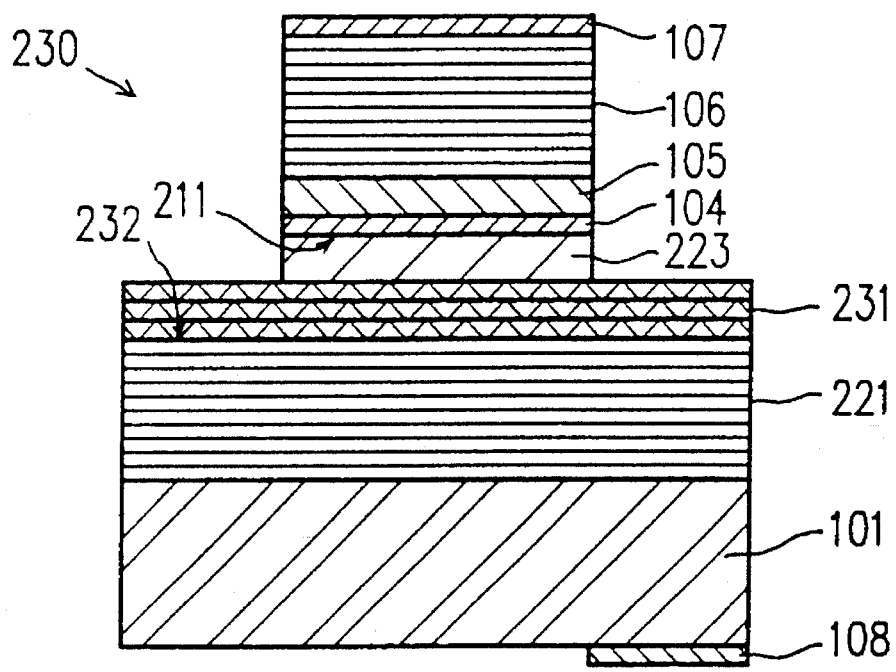
FIG. 7 is a cross sectional view showing a VCSEL of a third example of the present invention.

The third example of the present invention will be described with reference to the accompanying drawings. FIG. 7 schematically shows a cross section of a VCSEL 230. In FIG. 7, the components similar to those of the first and second examples will be denoted by the same reference numerals.

The VCSEL 230 includes a semiconductor substrate 101 made of p-type GaAs, a first p-type bottom mirror 221 formed on the semiconductor substrate 101, a second p-type bottom mirror 231 formed on the first p-type bottom mirror 221 and a p-type spacer layer 223 formed on the second p-type bottom mirror 231. The VCSEL 230 further includes an active region 104 formed on the p-type spacer layer 223, an n-type spacer layer 105 formed on the active region 104 and an n-type top mirror 106 formed on the n-type spacer layer 105. A p-type electrode 108 is provided on the semiconductor substrate 101 so as to be electrically connected thereto. An n-type electrode 107 is provided on the n-type top mirror 106 so as to be electrically connected thereto.

The first p-type bottom mirror 221 is a DBR, having a multi-layered structure composed of 21.5 pairs of a p-type GaAs layer (thickness: 69.6 nm, impurity concentration: $3\times10^{18}$ cm$^{-3}$) and a p-type AlAs layer (thickness: 82.8 nm, impurity concentration: $3\times10^{18}$ m$^{-3}$).

Figure 8:
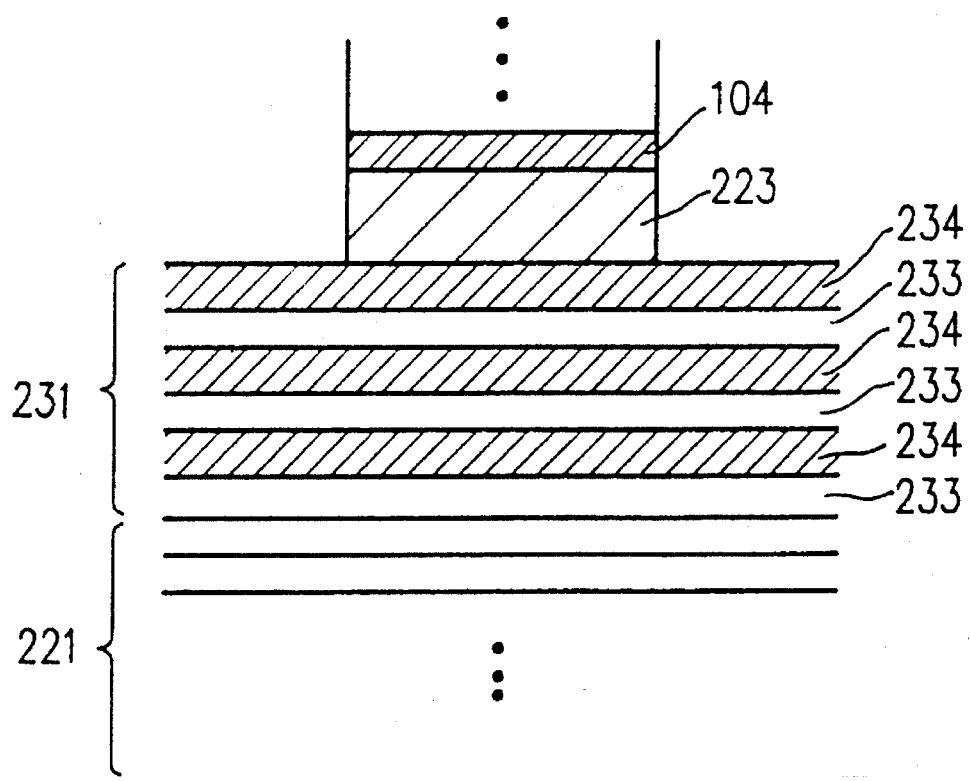
FIG. 8 is a diagram explaining details of the structure of a second p-type bottom mirror of the VCSEL of a third example of the present invention.

The second p-type bottom mirror 231 is also a DBR, and, as shown in FIG. 8, has a multi-layered structure composed of three pairs of a p-type GaAs layer 233 (thickness: 69.6 nm, impurity concentration: $3\times10^{18}$ cm$^{-3}$) and a p-type Al$_x$Ga$_{1-x}$As layer 234 (x=0.5, thickness: 75.7 nm, impurity concentration: $3\times10^{18}$ cm$^{-3}$). The composition ratio of Al is desirably 0.6 or less.

The p-type spacer layer 223 is made of Al$_{0.5}$Ga$_{0.5}$As and has a thickness of 86 nm and an impurity concentration of $3\times10^{18}$ cm$^{-3}$. The n-type spacer layer 105 is made of Al$_{0.5}$Ga$_{0.5}$As and has a thickness of 86 nm and an impurity concentration of $3\times10^{18}$ cm$^{-3}$. The n-type spacer layer 105 may be an undoped layer.

The active region 104 consists of a semiconductor multi-layer provided with a strained quantum well structure and includes an undoped In$_{0.2}$Ga$_{0.8}$As layer. The active region oscillates a laser beam of a wavelength of 980 nm. Moreover, the area of a bottom face 211 of the active region 104 is smaller than that of an upper face 232 of the p-type bottom mirror 221.

The n-type top mirror 106 is also a DBR, and has a multi-layered structure composed of 25 pairs of an n-type GaAs layer (thickness: 69.6 nm, impurity concentration: $3\times10^{18}$ cm$^{-3}$) and an n-type AlAs layer (thickness: 82.8 nm, impurity concentration: $3\times10^{18}$ cm$^{-3}$).

The VCSEL 230 of the present example is fabricated by the following procedure.

First, the semiconductor layers 221, 231, 223 and 104 through 106 are epitaxially grown on the semiconductor substrate 101 by the MBE method, MOCVD method or the like. The n-type electrode 107 is formed on the n-type top mirror 106. Then, using the n-type electrode 107 as a mask, the portions of the semiconductor layers 102 to 106 are etched by dry etching. Thereafter, the p-type electrode 108 is formed on the semiconductor substrate 101. Then, an alloy process is performed, and thereby ohmic contacts are formed between the n-type electrode 107 and the n-type top mirror 106 and between the p-type electrode 108 and the semiconductor substrate 101. It is also possible to form the n-type electrode 107 and the p-type electrode 108 by using an electrode material not requiring an alloy process.

In the VCSEL 230 of the present example, the second p-type bottom mirror 231 using Al$_x$Ga$_{1-x}$As (x≦0.6) is disposed on the first p-type bottom mirror 221. In the interface between Al$_{0.5}$Ga$_{0.5}$As of which the composition of Al is 0.6 or less and GaAs, the spike of the valence band arising due to the band gap and the difference of electron affinity is small. As a result, even at the same impurity concentration, the second p-type bottom mirror 231 has a lower sheet resistance than that of the first p-type bottom mirror 221.

Accordingly, in the VCSEL 230, when the current flows through the second p-type bottom mirror 231, the current flows so as to spread all over the second p-type bottom mirror 231 due to the low sheet resistance. Furthermore, the current dispersedly flows all over the upper face of the first p-type bottom mirror 221. Thus, it becomes possible to expand the current path, which causes the resistance of the VCSEL 230 as a whole to be reduced. This allows the continuous oscillation at room temperatures.

The difference in a refractive index between Al$_{0.5}$Ga$_{0.5}$As and GaAs is smaller than that between AlAs and GaAs. Accordingly, the reflection efficiency of the second p-type bottom mirror 231 becomes smaller than that of the first p-type bottom mirror 221. However, the second p-type bottom mirror 231 merely provides three pairs of an Al$_x$Ga$_{1-x}$As layer 234 and a GaAs layer 233. Accordingly, if it is assumed that the first p-type bottom mirror 221 and the second p-type bottom mirror 231 function as one bottom mirror, the reduction of the reflection efficiency is extremely small. The number of the layered pairs of an Al$_{0.5}$Ga$_{0.5}$As layer (x≦6) and a GaAs layer may be other than three. However, in the case of less than three, the resistance cannot be sufficiently reduced. Meanwhile, in the case where more than three pairs are layered, the reflection efficiency is significantly degraded.

According to one configuration, in the VCSEL 230 of the present example, the p-type spacer layer 223 may cover the entire upper face 232 of the second p-type mirror 231. According to another configuration, the optical path length of the resonator, i.e., the sum d of the optical path lengths of the n-type spacer layer 105, the active region 104 and the p-type spacer layer 223 in the perpendicular direction may be determined so as to satisfy the relationship expressed by $d=(n+1)\cdot\lambda/2$ (n: natural number). According to yet another configuration, the impurity concentration of the p-type spacer layer 223 may be higher than that of the second p-type mirror 231. By employing such configurations, the effects as described for the first example are also obtainable.

Example 4

Figure 9:
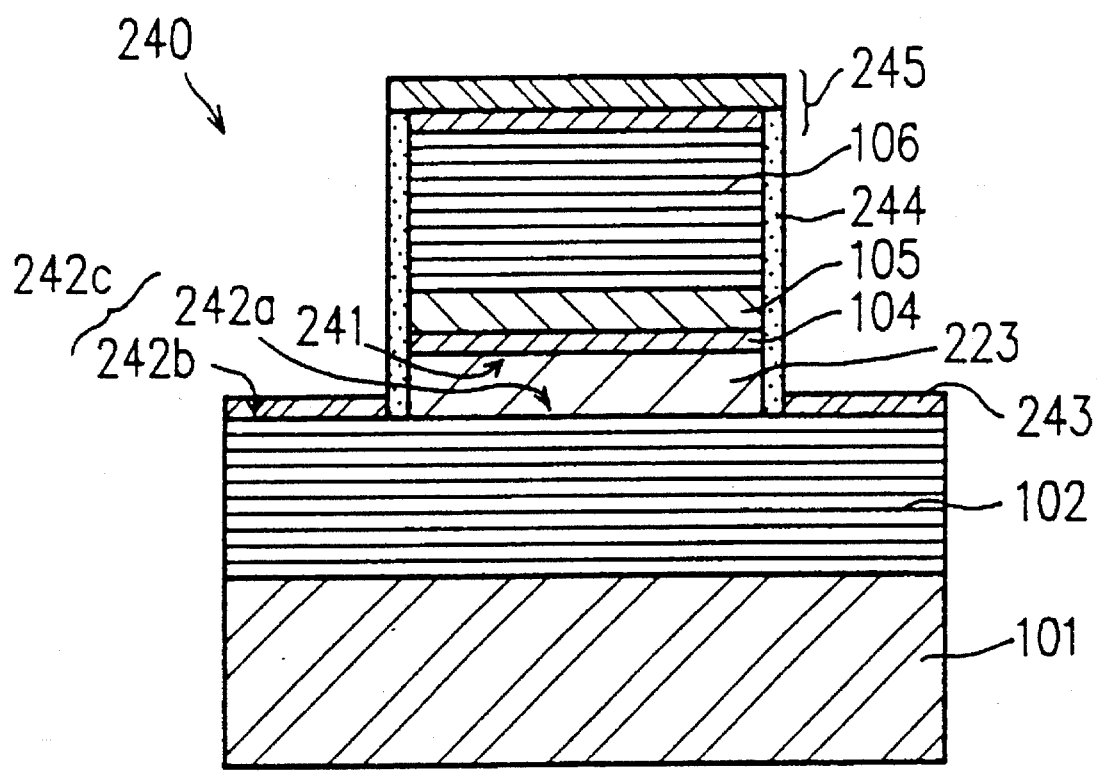
FIG. 9 is a cross sectional view showing a VCSEL of a fourth example of the present invention.

The fourth example of the present invention will be described with reference to the accompanying drawings. FIG. 9 schematically shows a cross section of a VCSEL 240. In FIG. 9, the components similar to those of the first example will be denoted by the same reference numerals.

The VCSEL 240 includes a semiconductor substrate 101 made of p-type GaAs, a first p-type bottom mirror 102 formed on the semiconductor substrate 101 and a p-type spacer layer 223 formed on the p-type bottom mirror 102. The VCSEL 240 further includes an active region 104 formed on the p-type spacer layer 223, an n-type spacer layer 105 formed on the active region 104 and an n-type top mirror 106 formed on the n-type spacer layer 105.

The p-type bottom mirror 102 has a multi-layered structure composed of 24.5 pairs of a p-type GaAs layer (thickness: 69.6 nm, impurity concentration: $3\times10^{18}$ cm$^{-3}$) and a p-type AlAs layer (thickness: 82.8 nm, impurity concentration: $3\times10^{18}$ cm$^{-3}$). The n-type top mirror 106 has a multi-layered structure composed of 25 pairs of an n-type GaAs layer (thickness: 69.6 nm, impurity concentration: $3\times10^{18}$ cm$^{-3}$) and an n-type AlAs layer (thickness: 82.8 nm, impurity concentration: $3\times10^{18}$ cm$^{-3}$).

The p-type spacer layer 223 is made of $Al_{0.5}Ga_{0.5}As$ and has a thickness of 86 nm and an impurity concentration of $3\times10^{18}$ cm$^{-3}$. The n-type spacer layer 105 is made of $Al_{0.5}Ga_{0.5}As$ and has a thickness of 86 nm and an impurity concentration of $3\times10^{18}$ cm$^{-3}$. The n-type spacer layer 105 may be an undoped layer.

The active region 104 consists of a semiconductor multi-layer provided with a strained quantum well structure and includes an undoped $In_{0.2}Ga_{0.8}As$ layer, and oscillates a laser beam of a wavelength of 980 nm. Moreover, the area of the bottom face 241 of the active region 104 is smaller than that of an upper face 242c of the p-type bottom mirror 102.

The upper face 242c includes a first region 242a and a second region 242b surrounding the first region 242a. The p-type spacer layer 223 is formed on the first region 242a and a p-type electrode 243 is formed on the second region 242b. Thus, the p-type electrode is formed in the second region 242b adjacent to the first region 242a of the upper face 242c of the p-type bottom mirror 102 in which the p-type spacer layer 223 is formed.

An insulating film 244 is formed on the side faces of the p-type spacer layer 223, the active region 104 and the n-type top mirror 106. Also, an n-type electrode 245 is formed on the n-type top mirror 106.

The method for fabricating the VCSEL 240 of the present example will be described with reference to FIGS. 10A through 10D.

Figure 10C:
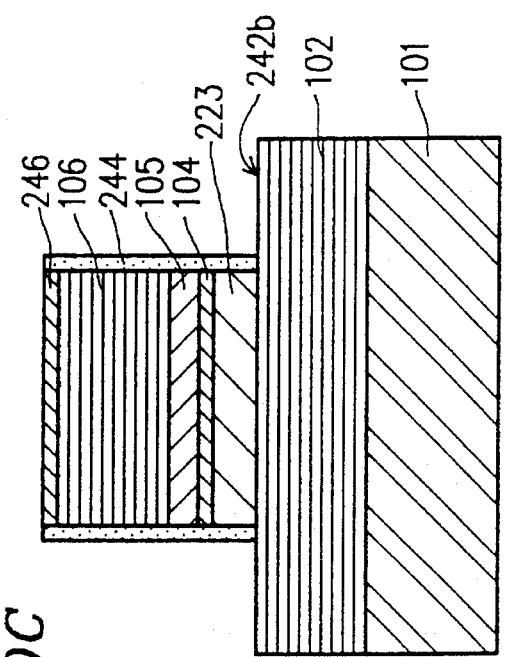
FIGS. 10A through 10D are diagrams explaining a method for fabricating the VCSEL of the fourth example of the present invention.
Figure 10D:
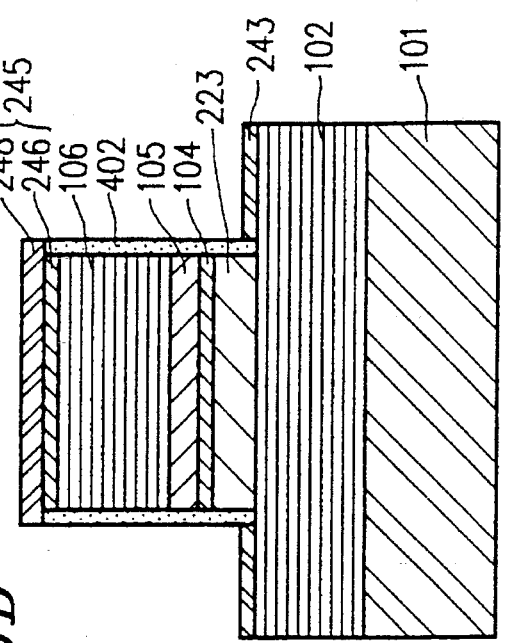
Figure 10A:
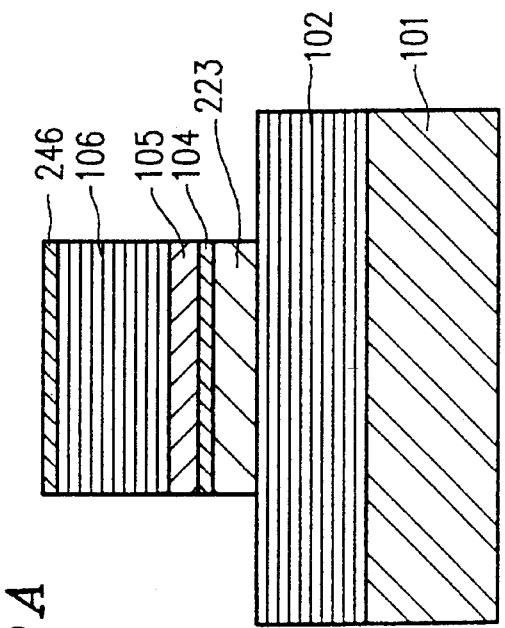

First, as shown in FIG. 10A, the semiconductor layers 102, 223, 104, 105 and 106 are epitaxially grown on the semiconductor substrate 101 by MBE method, MOCVD method or the like. Thereafter, a metallic film 246 made of an n-type electrode material is formed on the n-type top mirror 106. Then, using the metallic film 246 as a mask, the n-type top mirror 106, the n-type spacer layer 105, the active region 104 and the p-type spacer layer 223 are etched until the surface of the p-type bottom mirror 102 is exposed.

Figure 10B:
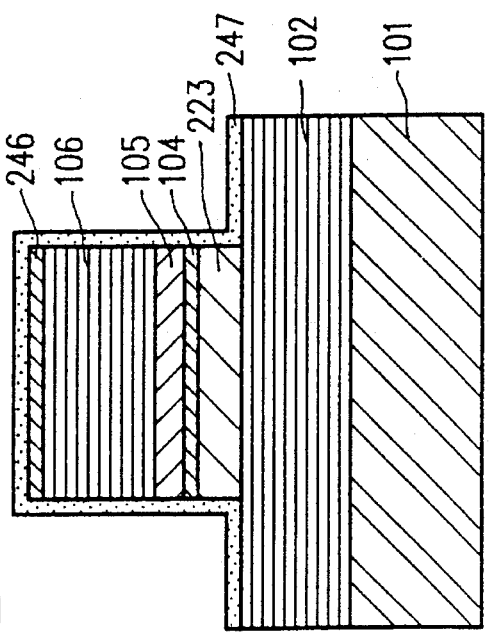

As shown in FIG. 10B, an insulating film 247 made of silicon nitride, silicon oxide or the like is deposited so as to cover the side faces of the n-type top mirror 106, the n-type spacer layer 105, the active region 104 and the p-type spacer layer 223, the exposed upper face of the p-type bottom mirror 102 and the metallic film 246. The insulating film 247 can be formed by a CVD method, a sputtering method or the like. As shown in FIG. 10C, the horizontal portions of the insulating film 247 are etched away so as to completely expose the surface of the metallic film 246 and the second region 242b of the p-type bottom mirror 102, whereby an insulating film 244 covering the side faces of the n-type top mirror 106, the n-type spacer layer 105, the active region 104 and the p-type spacer layer 223 is formed.

As shown in FIG. 10D, by depositing a metallic film made of a p-type electrode material so as to cover the entire face of the semiconductor substrate 101, the p-type electrode 243 is formed on the first region 242a of the p-type bottom mirror 102. At the same time, a metallic film 248 is deposited on the n-type electrode 246, thereby forming an n-type electrode 245 composed of the metallic films 246 and 248.

In the VCSEL 240 of the present example, the p-type electrode 243 is formed on the upper face 242 of the p-type bottom mirror 102, in a region adjacent to the region in which the p-type spacer layer 223 is formed. Since the side faces of the n-type top mirror 106, the n-type spacer layer 105, the active region 104 and the p-type spacer layer 223 are covered by the insulating film 244, the p-type electrode 243 can be formed on the upper face 242 of the p-type bottom mirror 102 so as to be close to the p-type spacer layer 223 without being electrically in contact with the active region 104. For this reason, the p-type electrode 243 functions as a lower resistance layer as well as an electrode, enhancing the expansion of the current path in the p-type mirror 102. As a result, the resistance of the laser is sufficiently reduced, so that the continuous oscillation at room temperatures is realized.

In the VCSEL 240 of the present example, the p-type spacer layer 223 may be formed so as to cover the entire upper face 242 of the p-type bottom mirror 102. In this case, the p-type electrode 243 may be provided on the region of the p-type spacer layer 223 adjacent to the region on which the active region 104 is formed. Alternatively, the optical path length of the resonator, i.e., the sum d of the total optical path lengths of the n-type spacer layer 105, the active region 104 and the p-type spacer layer 223 in the perpendicular direction may be determined so as to satisfy the relationship expressed by $d=(n+1)\cdot\lambda/2$ (n: natural number). Also, the impurity concentration of the p-type spacer layer 223 may be higher than that of the p-type bottom mirror 102. By employing such configurations, the effects as described for the first example are also obtainable.

Example 5

Figure 11:
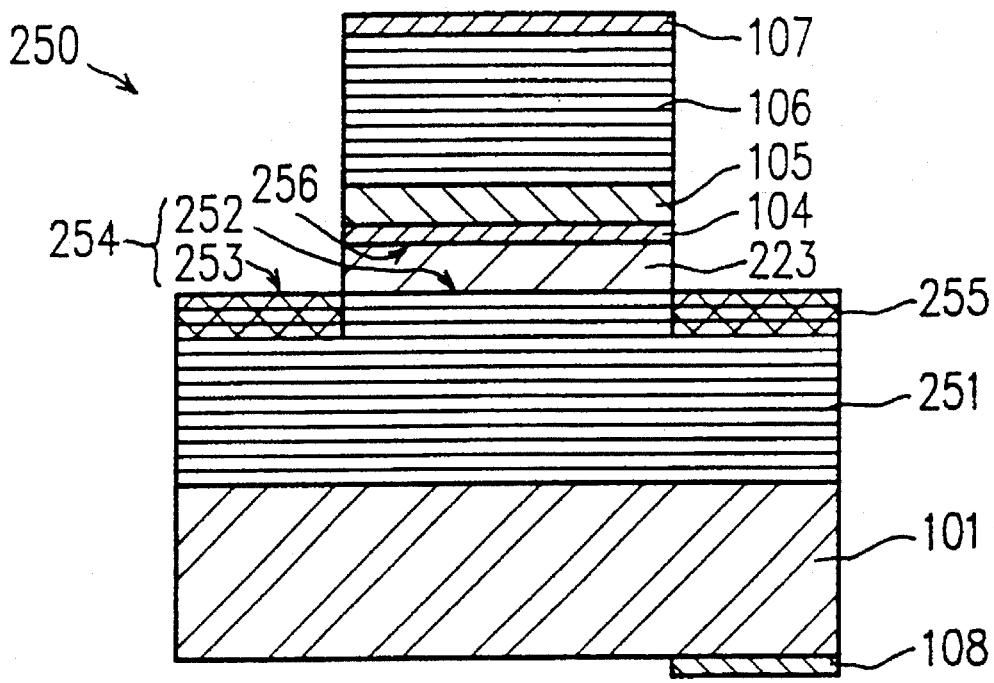
FIG. 11 is a cross sectional view showing a VCSEL of a fifth example of the present invention.
Figure 12:
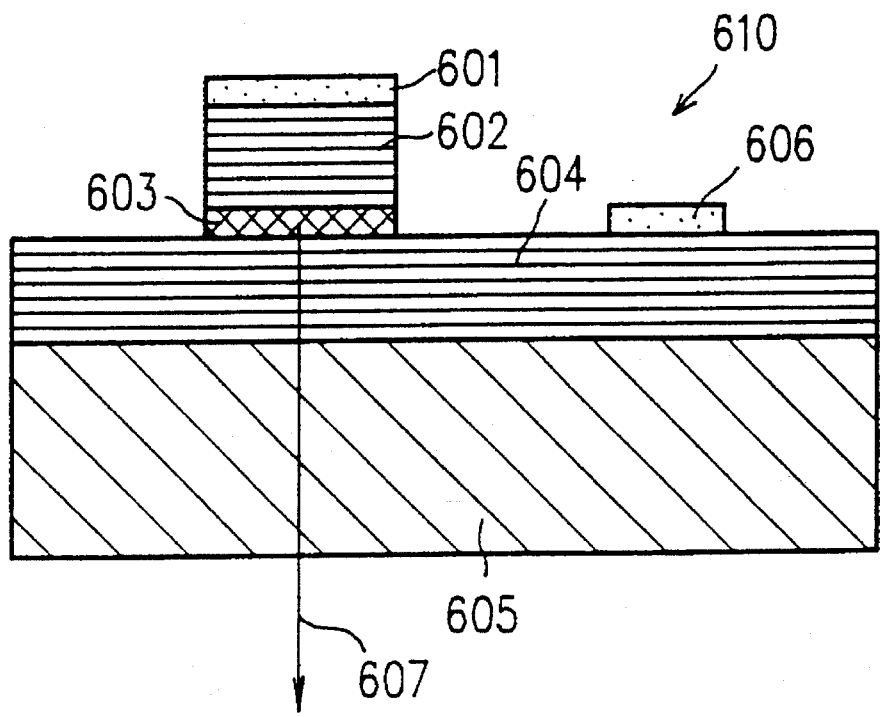
FIG. 12 is a cross sectional view showing a conventional VCSEL.
Figure 13:
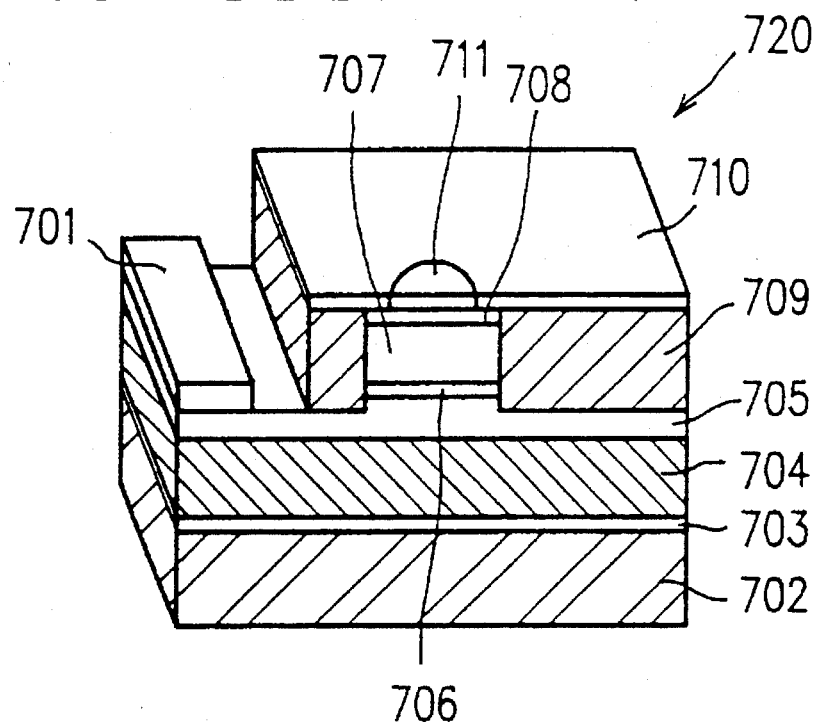
FIG. 13 is a cross sectional view showing another conventional VCSEL.
Figure 14:
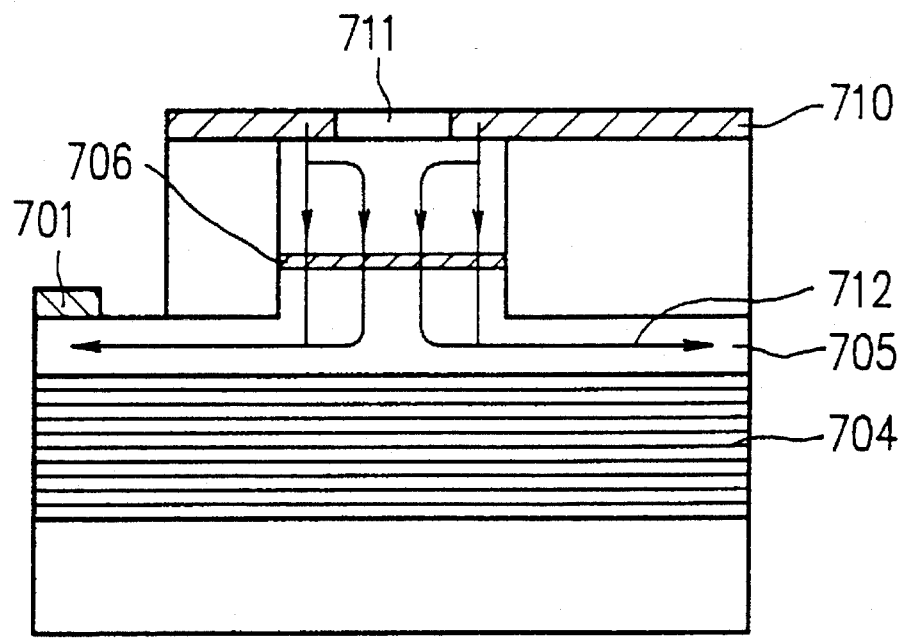
FIG. 14 is a diagram showing the path of an operational current flowing through the conventional VCSEL shown in FIG. 13.

The fifth example of the present invention will be described with reference to the accompanying drawings. FIG. 11 schematically shows a cross section of a VCSEL 250. In FIG. 11, the components of the VCSEL similar to those of the first to fourth examples will be denoted by the same reference numerals.

The VCSEL 250 includes a semiconductor substrate 101 made of p-type GaAs and a p-type bottom mirror 251 formed on the semiconductor substrate 101.

The p-type bottom mirror 251 has a multi-layered structure composed of 24.5 pairs of a p-type GaAs layer (thickness: 69.6 nm, impurity concentration: $3\times10^{18}$ cm$^{-3}$) and a p-type AlAs layer (thickness: 82.8 nm, impurity concentration: $3\times10^{18}$ cm$^{-3}$). Furthermore, the upper face 254 of the p-type bottom mirror 251 is divided into a first region 252 and a second region 253 enclosing the first region 252. In the portion just below the second region 253 within the p-type bottom mirror 251, a high impurity concentration layer 255 is provided. The high impurity concentration layer 255 is disposed from the second region 253 to a depth of about three pairs of a p-type GaAs layer and a p-type AlAs layer, and has a resistance ratio lower than those of other portions of the p-type bottom mirror 251.

The VCSEL 250 further includes a p-type spacer layer 223 formed on the first region 252 of the p-type bottom mirror 251, an active region 104 formed on the p-type spacer layer 223, an n-type spacer layer 105 formed on the active region 104 and an n-type top mirror 106 formed on the n-type spacer layer 105. Moreover, a p-type electrode 108 is provided on the semiconductor substrate 101 so as to be electrically connected thereto. Also, an n-type electrode 107 is provided on the n-type top mirror 106 so as to be electrically connected thereto.

The p-type spacer layer 223 is made of $Al_{0.5}Ga_{0.5}As$ and has a thickness of 86 nm and an impurity concentration of $3 \times 10^{18}$ cm$^{-3}$. The n-type spacer layer 105 is made of $Al_{0.5}Ga_{0.5}As$ and has a thickness of 86 nm and an impurity concentration of $3 \times 10^{18}$ cm$^{-3}$. The n-type spacer layer 105 may be an undoped layer.

The active region 104 consists of a semiconductor multi-layer provided with a strained quantum well structure and includes an undoped $In_{0.2}Ga_{0.8}As$ layer, and oscillates a laser beam of a wavelength of 980 nm. Moreover, the area of the bottom face 256 of the active region 104 is smaller than that of the upper face 254 of the p-type bottom mirror 102.

The n-type top mirror 106 has a multi-layered structure composed of 25 pairs of an n-type GaAs layer (thickness: 69.6 nm, impurity concentration: $3 \times 10^{18}$ cm$^{-3}$) and an n-type AlAs layer (thickness: 82.8 nm, impurity concentration: $3 \times 10^{18}$ cm$^{-3}$).

The method for fabricating the VCSEL 250 will be described hereinafter.

First, the semiconductor layers 251, 223 and 104 through 106 are epitaxially grown on the semiconductor substrate 101 by the MBE method, MOCVD method or the like. The n-type electrode 107 is formed on the n-type top mirror 106. Then, using the n-type electrode 107 as a mask, the n-type top mirror 106, the n-type spacer layer 105, the active region 104 and the p-type spacer layer 223 are etched by a dry etching method.

Next, using the n-type electrode 107 as a mask, beryllium ions are implanted into the p-type bottom mirror 251. Since the accelerated beryllium ions disorder a GaAs/AlAs hetero junction, the spike of the valence band arising due to the GaAs/AlAs hetero junction is eliminated. As a result, the high impurity concentration layer 255 having a lower resistivity in comparison with other portions of the p-type bottom mirror 251 is formed to a depth of about 460 nm.

In the VCSEL 250 of the present example, the operational current flows, via the first region 252, from the p-type spacer layer 223 to the p-type bottom mirror 251. In the p-type bottom mirror 251, the second region 253, i.e., the upper face of the high impurity concentration layer 255, surrounds the first region 252. Hence, the operational current dispersely flows to the high impurity concentration layer 255 having a low resistivity. The high impurity concentration layer 255 enhances the expansion of the current path in the p-type mirror 102, whereby the resistance of the p-type mirror 102 is reduced. Hence, the resistance of the whole VCSEL 250 is reduced, which makes it possible to perform the continuous oscillation at room temperatures.

In the p-type bottom mirror 251, the high impurity concentration layer 255, formed by the implantation of beryllium ions or the like, has lost the function as a mirror. This is because the AlAs/GaAs interface inside the layer is disturbed. However, insofar as only the portion just below the p-type spacer layer 223 functions as a mirror, a laser beam oscillated from the active region 104 can be trapped. Consequently, the functions of the p-type bottom mirror 251 are not degraded due to the provision of the high impurity concentration layer 255.

In the VCSEL 250 of the present example, the p-type spacer layer 223 may be formed so as to cover the entire upper face 254 of the p-type bottom mirror 251. In this case, the optical path length of the resonator, i.e., the sum d of the total optical path lengths of the n-type spacer layer 105, the active region 104 and the p-type spacer layer 223 in the perpendicular direction may be determined so as to satisfy the relationship expressed by $d=(n+1) \cdot \lambda/2$ (n: natural number). Also, the impurity concentration of the p-type spacer layer 223 may be higher than that of the p-type bottom mirror 251. By employing such configurations, the effects as described for the first example are also obtainable.

The above-mentioned first through fifth examples employ the VCSEL having a semiconductor substrate of n-type conductivity. However, an n-type semiconductor substrate may be used in place of the p-type semiconductor substrate. In this case, an undoped buffer layer is formed on the n-type semiconductor substrate, and the p-type bottom mirror is formed on the buffer layer. The VCSELs of the first, second, fourth and fifth examples may be fabricated by using an InP type semiconductor other than GaAs type, or a ZnSe type semiconductor.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A vertical-cavity surface-emitting semiconductor laser comprising:

a p-type bottom mirror having an upper face;

a p-type spacer layer covering over the entire upper face of the p-type bottom mirror;

an active region including an active layer having a bottom face smaller than the upper face of the p-type bottom mirror, the active region being formed on the p-type spacer layer;

an n-type spacer layer formed on the active region; and an n-type top mirror formed on the n-type spacer layer, wherein a sum d of optical path lengths of the p-type spacer layer, the active region and the n-type spacer layer in a perpendicular direction, satisfies a relationship expressed by $d=(1+n) \cdot \lambda/2$ (n: natural number) with respect to a wavelength $\lambda$ of light oscillated from the active region.

2. A vertical-cavity surface-emitting semiconductor laser according to claim 1, wherein the p-type spacer layer has an optical path length in the perpendicular direction at least more than $\lambda/2$.

3. A vertical-cavity surface-emitting semiconductor laser according to claim 1, wherein the p-type spacer layer has an impurity concentration higher than that of the p-type bottom mirror.

4. A vertical-cavity surface-emitting semiconductor laser according to claim 1, further comprising a p-type electrode formed in a region adjacent to a region of the upper face of the p-type bottom mirror in which the active region is formed.

5. A vertical-cavity surface-emitting semiconductor laser according to claim 4, further comprising an insulating film covering a side face of the active region.

6. A vertical-cavity surface-emitting semiconductor laser comprising:
- a first p-type bottom mirror;
- a second p-type bottom mirror having an upper face of a sheet resistance lower than that of the first p-type bottom mirror, the second p-type bottom mirror being formed on the first p-type bottom mirror;
- a p-type spacer layer formed on the second p-type bottom mirror;
- an active region including an active layer having a bottom face smaller than the upper face of the second p-type bottom mirror, the active region being formed on the p-type spacer layer;
- an n-type spacer layer formed on the active region; and
- an n-type top mirror formed on the n-type spacer layer.

7. A vertical-cavity surface-emitting semiconductor laser according to claim 6, wherein the second p-type bottom mirror is a p-type graded mirror.

8. A vertical-cavity surface-emitting semiconductor laser according to claim 7, wherein the second p-type bottom mirror has a plurality of pairs each consisting of a first semiconductor layer and a second semiconductor layer, and layers each interposed between the first and second semiconductor layers and having a composition which changes continuously or in discrete steps from a composition of the first semiconductor layer to that of the second semiconductor layer.

9. A vertical-cavity surface-emitting semiconductor laser according to claim 7, wherein the second p-type bottom mirror has three pairs each consisting of the first and second semiconductor layers.

10. A vertical-cavity surface-emitting semiconductor laser according to claim 6, wherein the second p-type bottom mirror has a plurality of pairs each consisting of a first semiconductor layer and a second semiconductor layer, the first semiconductor layer being made of GaAs, and the second semiconductor layer being made of $Al_xGa_{1-x}As$ ($x \leq 0.6$).

11. A vertical-cavity surface-emitting semiconductor laser according to claim 10, wherein the second p-type bottom mirror has three pairs each consisting of the first and second semiconductor layers.

12. A vertical-cavity surface-emitting semiconductor laser according to claim 6, wherein a sum d of optical path lengths of the p-type spacer layer, the active region and the n-type spacer layer in a perpendicular direction satisfies a relationship expressed by $d=(1+n) \cdot \lambda/2$ (n: natural number) with respect to a wavelength $\lambda$ of light oscillated from the active region.

13. A vertical-cavity surface-emitting semiconductor laser according to claim 12, wherein the p-type spacer layer has an optical path length at least more than $\lambda/2$.

14. A vertical-cavity surface-emitting semiconductor laser according to claim 12, wherein the p-type spacer layer has an impurity concentration higher than that of the p-type bottom mirror.

15. A vertical-cavity surface-emitting semiconductor laser comprising:
- a p-type bottom mirror having an upper face;
- a p-type spacer layer formed on the p-type bottom mirror;
- an active region including an active layer having a bottom face smaller than the upper face of the p-type bottom mirror, the active region being formed on the p-type spacer layer;
- an n-type spacer layer formed on the active region;
- an n-type top mirror formed on the n-type spacer layer; and
- a p-type electrode formed in a region adjacent to a region of the upper face of the p-type bottom mirror in which the spacer layer is formed.

16. A vertical-cavity surface-emitting semiconductor laser according to claim 15, further comprising an insulating film covering a side face of the active region.

17. A vertical-cavity surface-emitting semiconductor laser comprising:
- a p-type bottom mirror having an upper face, wherein the upper face includes a first region and a second region surrounding the first region, a portion of the p-type bottom mirror below the second region has a lower resistivity than that of a portion of the p-type bottom mirror below the first region;
- a p-type spacer layer formed on the first region of the upper face of the p-type bottom mirror;
- an active region including at least an active layer having a bottom face smaller than the upper face of the p-type bottom mirror, the active region being formed on the p-type spacer layer;
- an n-type spacer layer formed on the active region; and
- an n-type top mirror formed on the n-type spacer layer.

18. A vertical-cavity surface-emitting semiconductor laser according to claim 17, wherein a sum d of optical path lengths of the p-type spacer layer, the active region and the n-type spacer layer in a perpendicular direction satisfies a relationship expressed by $d=(1+n) \cdot \lambda/2$ (n: natural number) with respect to a wavelength $\lambda$ of light oscillated from the active region.

19. A vertical-cavity surface-emitting semiconductor laser according to claim 18, wherein the p-type spacer layer has an optical path length at least more than $\lambda/2$.

20. A vertical-cavity surface-emitting semiconductor laser according to claim 18, wherein the p-type spacer layer has an impurity concentration higher than that of the p-type bottom mirror.

* * * * *